(12) United States Patent
Beck et al.

(10) Patent No.: US 7,824,190 B2
(45) Date of Patent: Nov. 2, 2010

(54) CONNECTOR FOR CONNECTING CONDUCTORS OF A CABLE TO FLAT CONDUCTORS OF A PHOTOVOLTAIC CELL

(75) Inventors: Thorsten Beck, Bad Arolsen-Wetterburg (DE); Klaus Holterhoff, Olpe (DE); Matthias Boensch, Bielefeld (DE); Klaus Pueschner, Detmold (DE); Torsten Wuensche, Leopoldshoehe (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 0 days.

(21) Appl. No.: 12/550,362

(22) Filed: Aug. 29, 2009

(65) Prior Publication Data

US 2010/0075531 A1 Mar. 25, 2010

(30) Foreign Application Priority Data

Sep. 22, 2008 (DE) .................. 20 2008 012 585 U
Jun. 17, 2009 (DE) .................. 20 2009 004 930 U

(51) Int. Cl.
*H01R 9/22* (2006.01)
*H01R 12/00* (2006.01)
*H01L 25/00* (2006.01)

(52) U.S. Cl. ................. 439/76.1; 439/709; 136/243
(58) Field of Classification Search ............... 439/76.1, 439/709, 620.21, 620.22; 136/243, 244
See application file for complete search history.

(56) References Cited

U.S. PATENT DOCUMENTS 4,460,232 A 7/1984 Sotolongo

| | | | |
|---|---|---|---|
| 7,097,516 B2 * | 8/2006 | Werner et al. | 439/709 |
| 7,387,537 B1 * | 6/2008 | Daily et al. | 439/620.22 |
| 7,632,109 B2 * | 12/2009 | Boensch et al. | 439/76.1 |
| 7,648,371 B2 * | 1/2010 | Boensch et al. | 439/76.1 |
| 7,655,859 B2 * | 2/2010 | Naβ et al. | 136/243 |

FOREIGN PATENT DOCUMENTS

| DE | 203 11 183 U1 | 8/2004 |
|---|---|---|
| DE | 20 2005 018 884 U1 | 3/2006 |
| WO | WO 2007/118798 A2 | 10/2007 |

* cited by examiner

*Primary Examiner*—Chandrika Prasad
(74) *Attorney, Agent, or Firm*—Lawrence E. Laubscher, Sr.; Lawrence E. Laubscher, Jr.

(57) ABSTRACT

A connector arrangement connects the flat conductors that extend upwardly from a horizontal photovoltaic cell panel with the insulated conductors of a cable via the circuits of a printed circuit board, respectively. A flat conductor support member is adhesively secured to the upper surface of the horizontal photovoltaic cell panel and includes upwardly extending bridge portions having flat upper edges about which are reversely bent the upper free ends of the flat conductors. A hollow sectional connector housing includes a lower body section containing a bottom opening that receives the flat conductor support member when the lower body section is seated on the panel upper surface. Bifurcated resilient contacts mounted on the lower section have first portions that engage the bent flat conductor ends, respectively, and second portions that engage the circuits on a replaceable printed circuit board carried by the removable upper cover section of the housing.

19 Claims, 11 Drawing Sheets

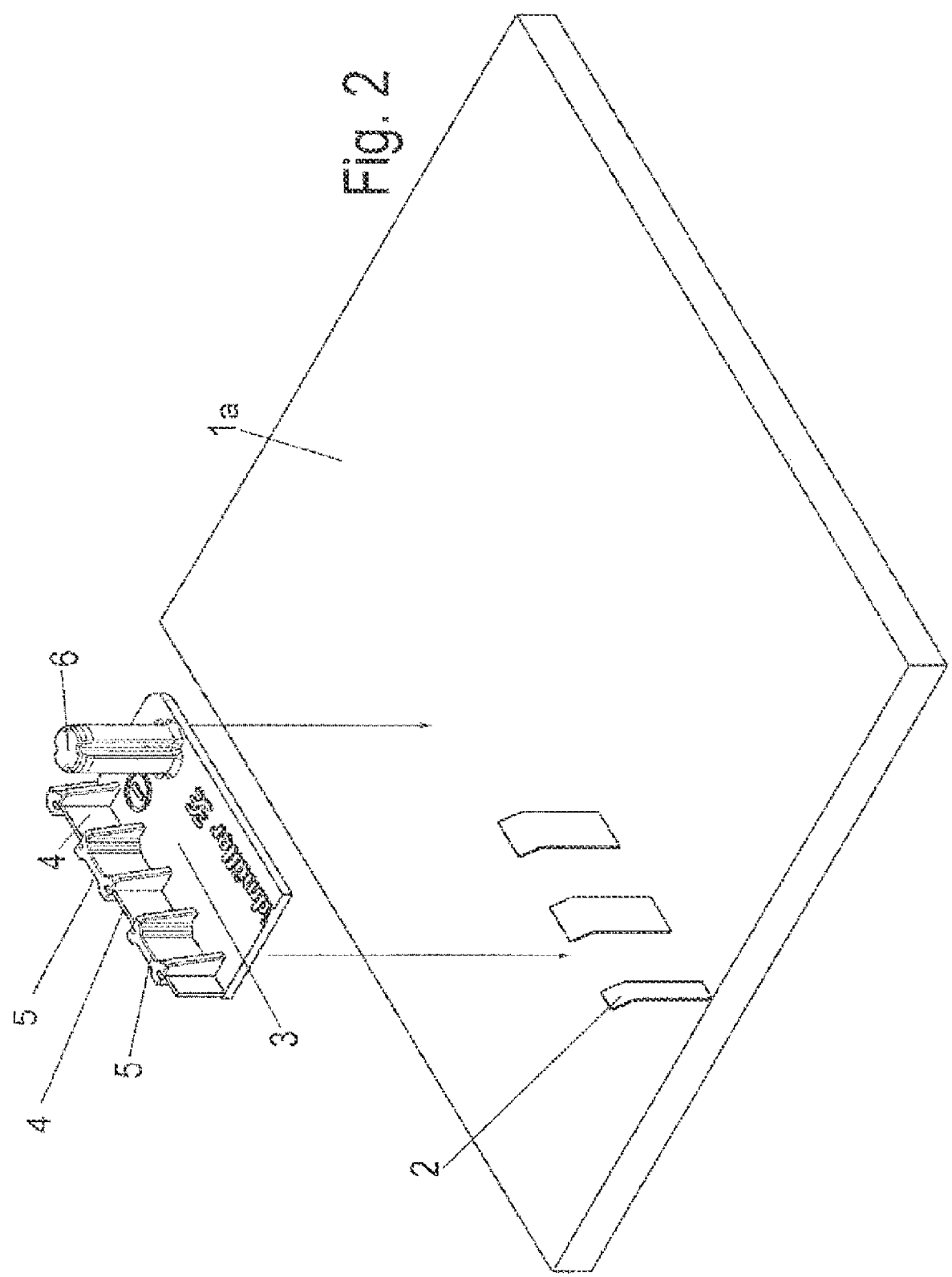

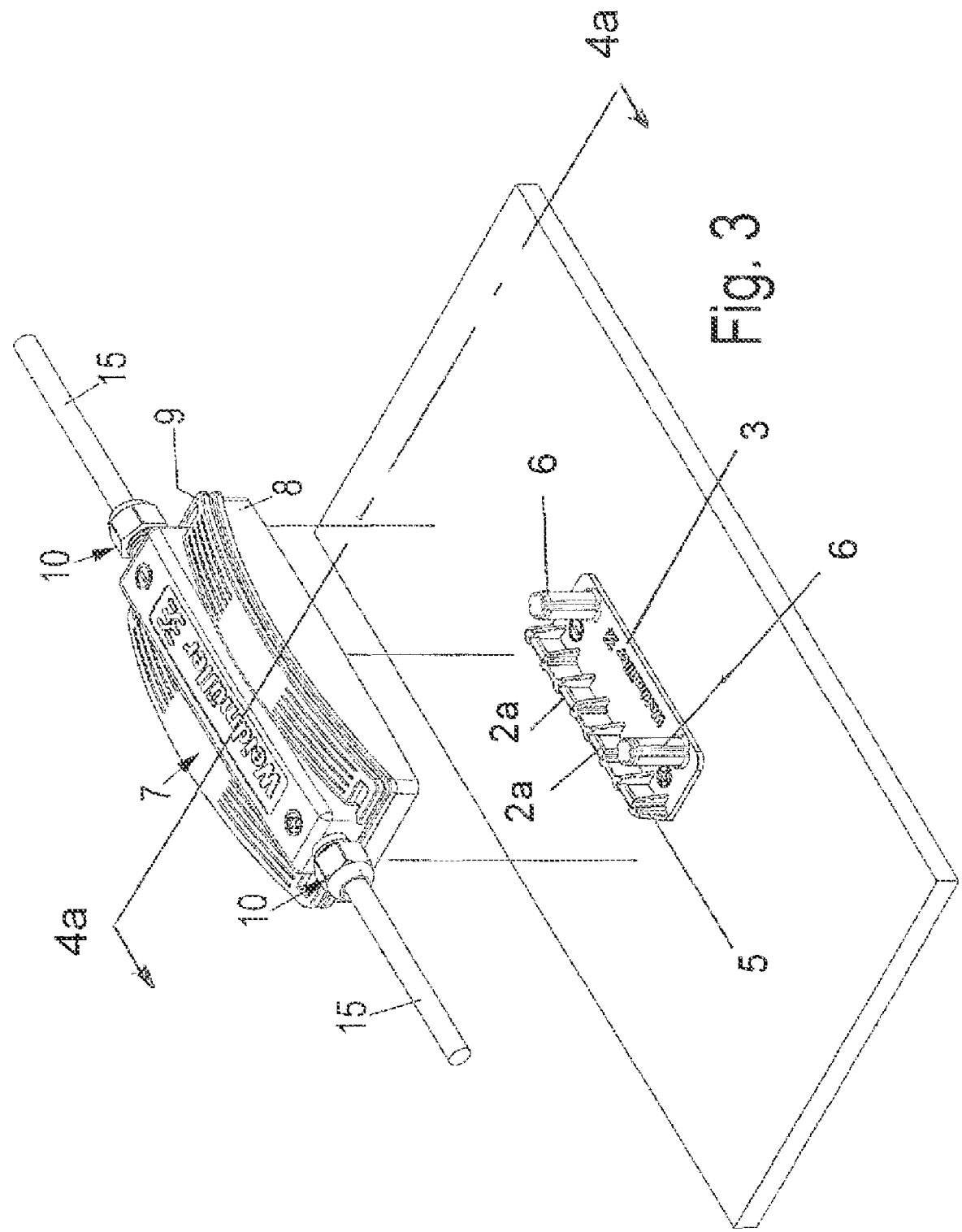

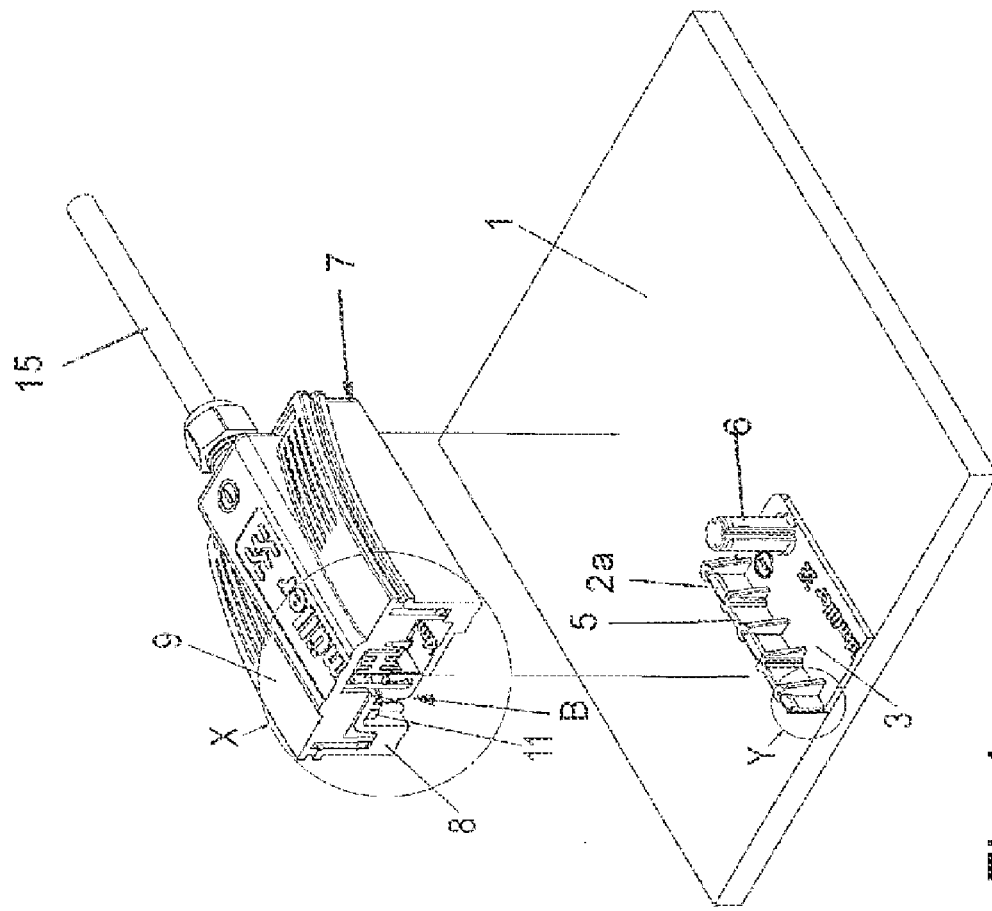
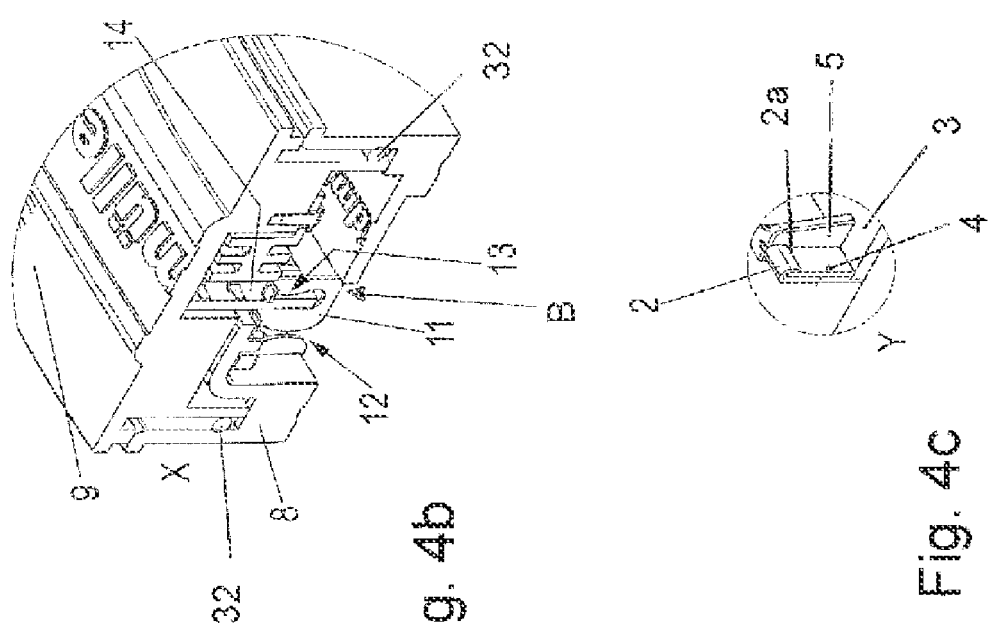

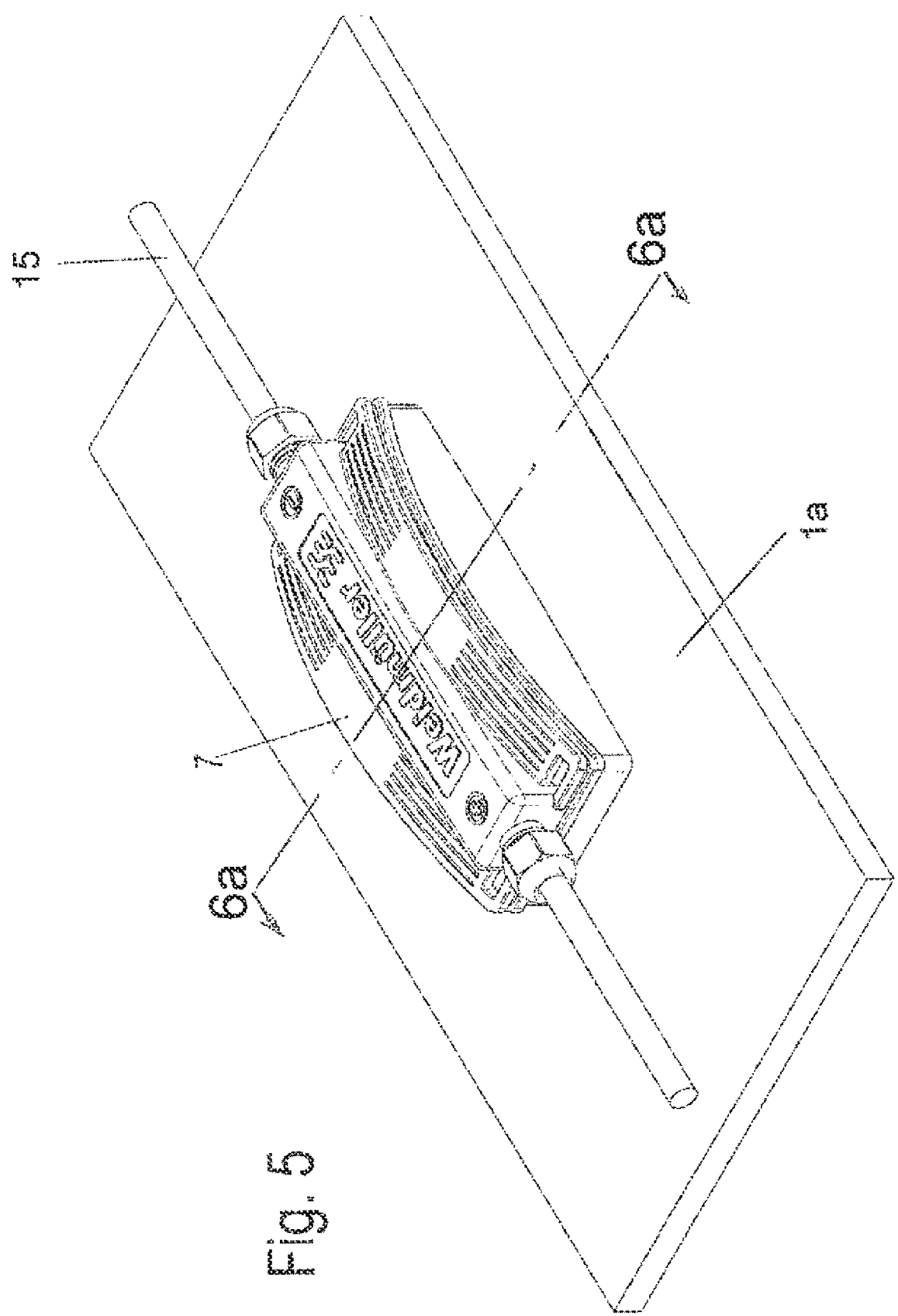

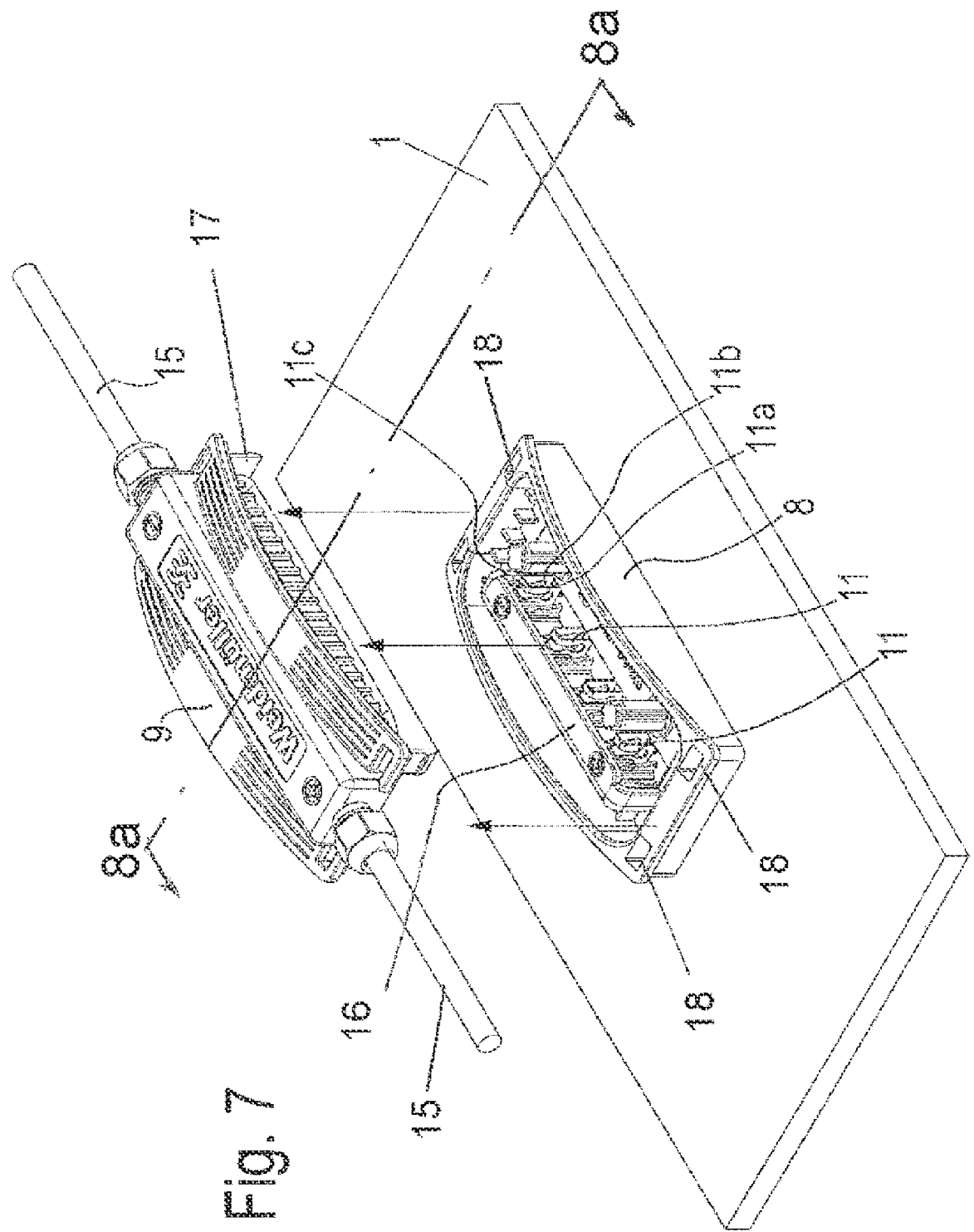

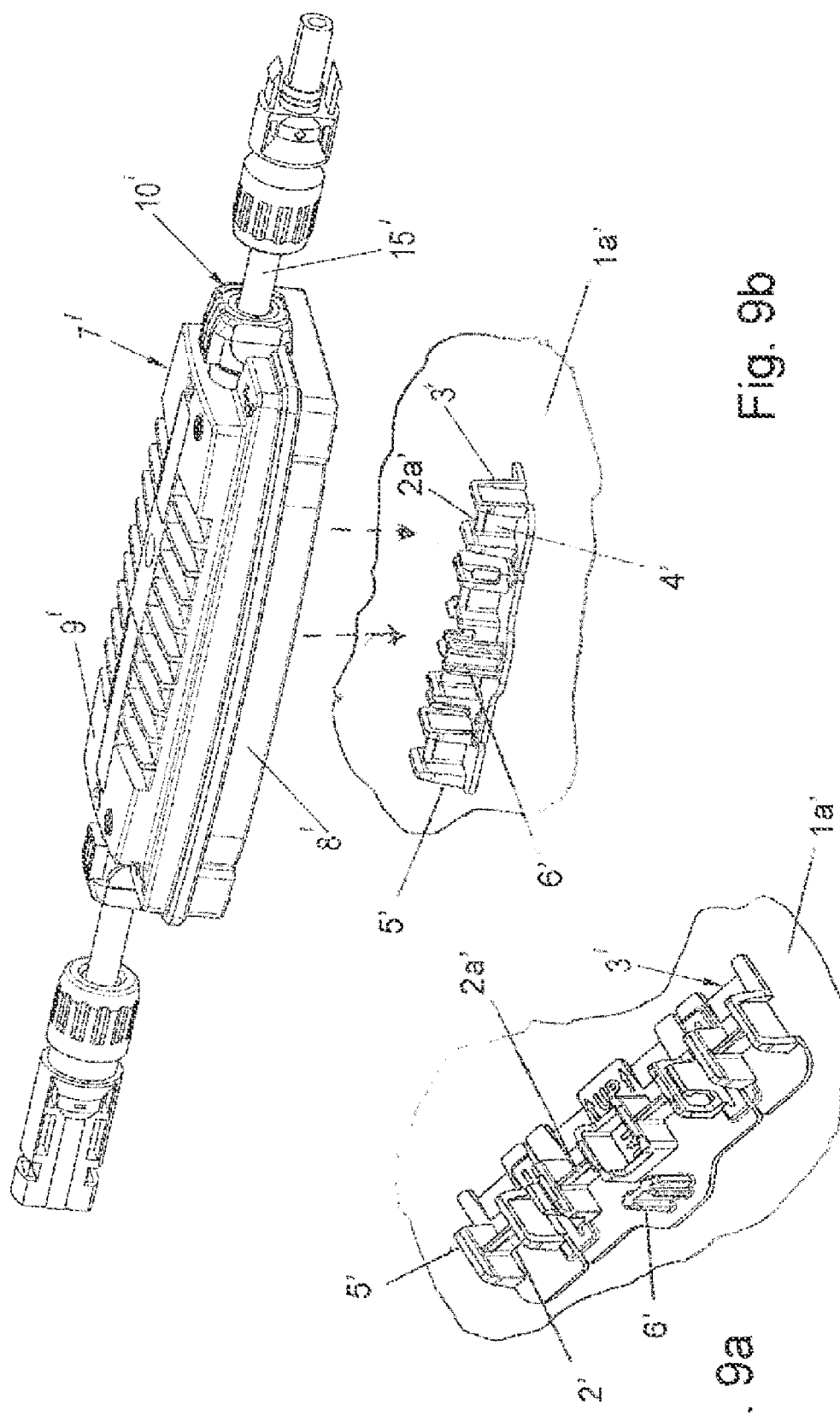

CONNECTOR FOR CONNECTING CONDUCTORS OF A CABLE TO FLAT CONDUCTORS OF A PHOTOVOLTAIC CELL

BACKGROUND OF THE INVENTION

1. Field of the Invention

A connector arrangement connects the flat conductors that extend upwardly from a horizontal photovoltaic cell panel with the insulated conductors of a cable via the circuits of a printed circuit board, respectively. A flat conductor support member is adhesively secured to the upper surface of the horizontal photovoltaic cell panel and includes upwardly extending bridge portions having flat upper edges about which are reversely bent the upper free ends of the flat conductors. A hollow sectional connector housing includes a lower body section containing a bottom opening that receives the flat conductor support member when the lower body section is seated on the panel upper surface. Bifurcated resilient contacts mounted on the lower section have first portions that engage the bent flat conductor ends, respectively, and second portions that engage the circuits on a replaceable printed circuit board carried by the removable upper cover section of the housing.

2. Description of Related Art

Photovoltaic cell systems generally have at least one photovoltaic panel for current generation from sunlight, together with flexible flat conductor ends that extend out of the photovoltaic panels for connection with the insulated conductors of a cable, which makes it possible to connect the photovoltaic panels to a building installation via an inverter arrangement or the like.

Working with the state of the art, the individual flat conductors must be contacted manually by means of individual binding posts or the like. This is why connecting the appliances is relatively laborious and, as a rule, it is necessary to employ specially trained experts for the purpose of connecting the appliances.

Furthermore, there is the problem that installations, constructed in this way, as a rule, are relatively unitary and therefore are very difficult to repair in case of trouble.

As evidenced by the German patents Nos. DE 20 2005 018 884 U1 and DE 203 11 183U1 and the Sotolongo U.S. Pat. No. 4,460,232, it is also known to provide connector housings by means of which the conductor ends are contacted. The Published International Application No. WO2007/118798A2 furthermore discloses a connector device for conductor ends, in particular, flat conductor ends on a photovoltaic panel out of which protrudes a plurality of flat conductor ends, and which has a receiving housing as well as a receiving unit that can be attached to the photovoltaic panel and that, in particular, can be adhesively fastened upon the latter for the purpose of receiving the flat conductor ends upon which the receiving housing can be stuck. The receiving unit is made as a receiving carrier, which has at least one seat or a plurality of seats, especially seat bridges over which each one of the flat conductor ends can be bent, which flat conductor ends in this position can be contacted by bell contacts that in the course of current generation represent the particular current-conducting elements.

Although this type of contacting has generally proved to be effective, it is desirable to simplify handling for maintenance purposes. The present invention was developed to solve this problem.

SUMMARY OF THE INVENTION

Accordingly, a primary object of the invention is to provide a connector arrangement for connecting the flat conductors that extend upwardly from a horizontal photovoltaic cell panel with the insulated conductors of a cable via the circuits of a printed circuit board, respectively, use being made of a flat conductor support member that is adhesively secured to the upper surface of the horizontal photovoltaic cell panel and includes upwardly extending bridge portions having flat upper edges about which are the upper free ends of the flat conductors are reversely bent for connection with the circuits of a replaceable printed circuit board.

According to a more specific object of the invention, a hollow sectional connector housing includes a lower body section containing a bottom opening that receives the flat conductor support member when the lower body section is seated on the panel upper surface. Bifurcated resilient contacts mounted on the lower section have first portions that engage the bent flat conductor ends, respectively, and second portions that engage the circuits on the replaceable printed circuit board which is carried by the removable upper cover section of the housing.

In the preferred embodiment of the invention, when the connector housing upper cover section is removed to replace the printed circuit board carried thereby, the resilient contacts remain in electrical engagement with the reversely bent end portions of the flat conductors, respectively. An integral horizontal flange portion on the loser body section extends over the spring contacts to retain them on the lower body section in engagement with the reversely bent conductor end portions. In an alternate embodiment, the resilient contacts and the printed circuit board are carried in a preassembled condition by the cover section for simultaneous removal therewith relative to the housing lower body section and the flat conductor support member that remain secured to the photovoltaic cell.

The present invention provides a connector arrangement for conductor ends, especially flat conductor ends or knife contacts on a photovoltaic panel out of which protrude a plurality of conductor ends, and which has a connector housing with an electronic circuit received in the connection housing and a conductor support unit that can be attached to the photovoltaic panel, which, in particular, can be glued on it for the purpose of receiving the conductor ends and upon which the connector housing can be attached, whereby the flat conductor ends can be contacted by means of current-conductive contacts and whereby the connection housing has a base part and a cover part, and as the cover part is removed from the base part, the base part remains glued together with the receiving unit on the photovoltaic panel.

The base part remains on the photovoltaic panel; therefore, as it is being serviced, it need not again have to be separated from the latter laboriously. Instead, it is merely necessary to take the lid part off the base part in that one releases a catch and/or catch groove or some other locking device between these elements and then the lid part can be exchanged completely with a printed circuit board, especially with inverters, diodes and possibly other components.

There is furthermore a need for optimization with a view to the danger arising in case of any need for service to the effect that the conductor ends can be damaged when the servicing is done. This danger is to be reduced.

Accordingly, the invention creates a connector arrangement for conductor ends, in particular, flat conductor ends on a photovoltaic panel out of which protrude a plurality of flat conductor ends, and which has a connector housing and a conductor support unit that can be attached upon the photovoltaic panel, in particular, which can be adhesively secured upon the latter for the purpose of receiving the conductor ends upon which the connector housing can be attached, whereby the flat conductor ends during operation can—that is to say, in case of photovoltaic current generation—be contacted by means of current-conductive contacts, and whereby the connection housing has a base part and a cover part, and whereby the connection contacts are so designed and arranged that, during removal of the lid part from the base part, they will remain on the photovoltaic panel in the conductor end contacting state, whereas an electronic circuit fixed upon the lid part can be removed as a unit together with the lid part from the base part—and can thus be exchanged.

In this way, the connection contacts during the removal of the lid part from the base part remain on the conductor end—in particular, on the flat conductor end—in the contacted position so that the danger of disturbances during servicing is rather minor, whereas, on the other hand, the electronic circuit—in particular, in case of a printed circuit board with diodes—can be removed from the base part as a unit together with the cover part and can thus be exchanged. In that way, one can ensure simple and safe maintenance of the connection device—particularly with regard to the electronics.

BRIEF DESCRIPTION OF THE DRAWINGS

Other objects and advantages of the invention will become apparent from a study of the following specification, when viewed in the light of the accompanying drawing, in which:

FIG. 2 is a sectional view taken along line 2-2 of FIG. 1;

FIG. 3 is a perspective view illustrating the step of connecting the connector housing to the flat conductor support member following its mounting on the photovoltaic cell panel;

FIG. 4a is a perspective sectional taken along line 4a-4a of FIG. 3, FIG. 4b is an enlarged view of the detailed portion shown by the circle X in FIG. 4a, and FIG. 4c is an enlarged view of the detailed portion shown by the circle Y in FIG. 4a;

FIG. 5 is a perspective view of the connector housing of FIG. 3 mounted on the photovoltaic cell panel concentrically around the flat conductor support member;

FIG. 6b is an enlarged view of the detailed portion shown by the circle Z of FIG. 6a;

FIG. 7 is a perspective view illustrating the housing upper cover section disconnected from the housing lower body section;

FIG. 8b is an enlarged view of the detailed portion shown by the circle L in FIG. 8a, and FIG. 8c is an enlarged view of the detailed portion shown by the circle M in FIG. 8a;

FIG. 9a is a perspective view of a second form of the flat conductor support member, and FIG. 9b is a perspective view illustrating the manner of assembly of the connector housing to the flat conductor support member;

DETAILED DESCRIPTION OF THE INVENTION

Figure 1:
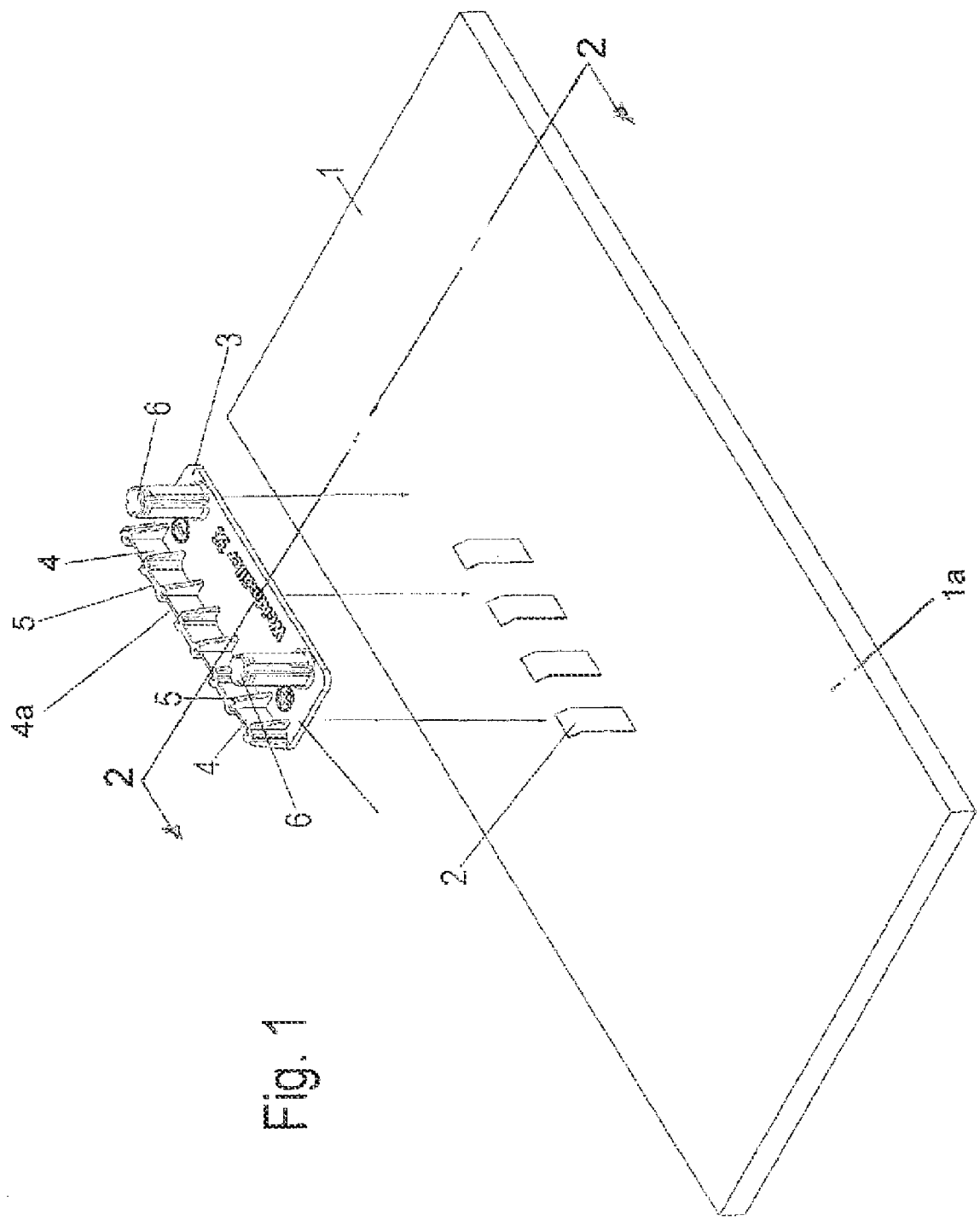
FIG. 1 is a perspective view illustrating the initial assembly step of mounting the flat conductor support member on the upper surface of the panel of a photovoltaic cell.

Referring first more particularly to FIGS. 1 and 2, the photovoltaic cell 1 includes a generally horizontal planar rectangular support panel 1a from which extend vertically a plurality of flat coplanar conductors 2. A flat conductor support member 3 formed from a suitable synthetic plastic electrically insulting material includes a base portion 3a that is secured to the panel upper surface, for example, by a two-side adhesive strip, adjacent the flat conductors 2. Extending upwardly from the base portion 3a are a plurality of integral bridge portions 4 having horizontal flat upper edges 4a that are separated from each other by integral separator walls 5. As best shown in FIG. 4c, the free upper ends 2a of the flat conductors 2 are reversely bent downwardly about the bridge edges 4a, respectively. A pair of integral guide pedestals 6 extend vertically upwardly from the base portion 3a of the flat conductor support member 3, which guide pedestals are adapted to extend into corresponding guide openings contained in the bottom surface of the connector housing 7 (FIG. 3), thereby to guide the connector housing toward the seated position on the photovoltaic cell panel shown in FIG. 5. The connector housing 7, which is formed from a suitable electrically insulting synthetic plastic material, is sectional and contains a chamber defined between the lower body section 8 and the upper cover section 9. The adjacent ends of cables 15 extend into the housing chamber via openings 10, respectively.

Figure 6A:
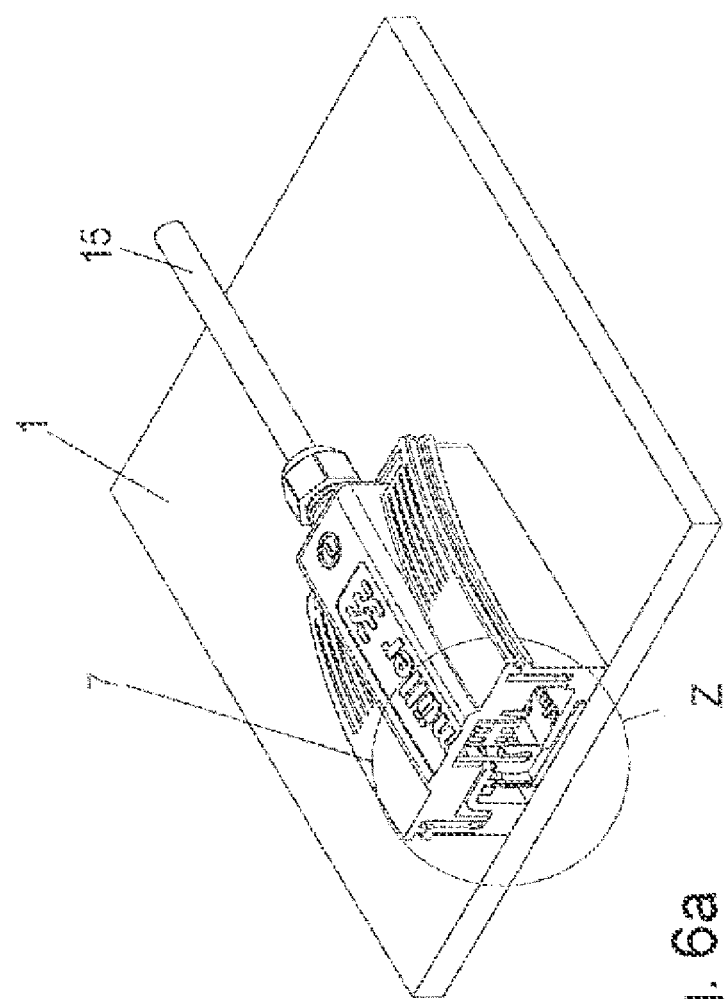
FIG. 6a is a sectional view taken along line 6a-6a of FIG. 5.
Figure 6B:
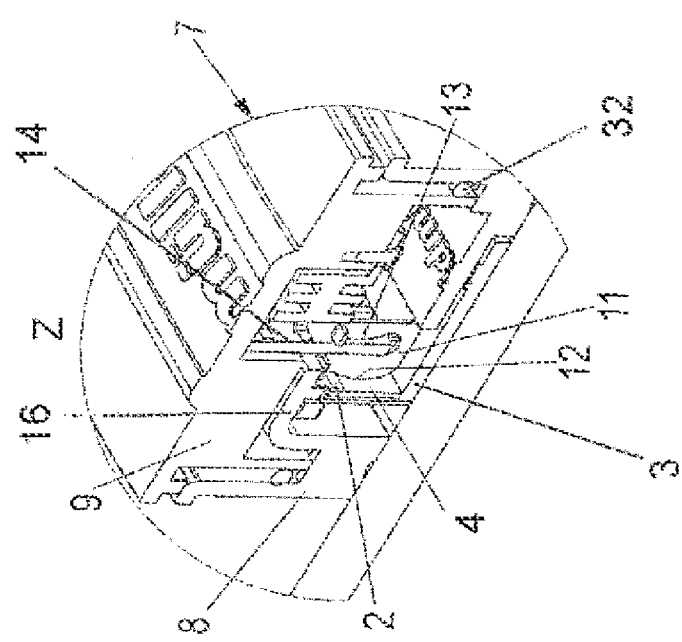

Referring to FIGS. 4a and 4b, the bottom surface of the lower body section 8 of the connector housing 7 connector housing contains a bottom through opening B adjacent which are mounted on the lower body section 7 a row of resilient electrical contacts 11 that are bifurcated to define first and second resilient portions 12 and 13. The bottom opening B is adapted to receive the flat conductor support member 3 of FIG. 3 when the connector housing 7 is seated on the photovoltaic cell panel as shown in FIGS. 5 and 6a. Preferably, the bottom surface of the housing lower body section is adhesively secured to the upper surface of the photovoltaic cell panel, as for example, by a two-sided adhesive strip. As shown in FIG. 6b, the resilient contact portions 12 are arranged for engagement with the reversely bent end portions 2a of the corresponding flat conductors 2 that are supported on the edges 4a of the bridges 4, respectively. The resilient second contact portions 13 are arranged for engagement with corresponding electrical circuits carried by the adjacent face of a vertical printed circuit board 14 that extends at its lower end between the contact portions 12 and 13 of the row of contacts 11. At its upper end, the printed circuit board 14 is connected with and carried by the upper cover section 9. The electrical circuits of the printed circuit board 14 are respectively connected in a conventional manner with the ends of corresponding insulated conductors of the cables, which circuits may include electronic components, such as diodes, inverters or the like. Thus, the printed circuit board biases the contact portions 12 into engagement with the corresponding flat conductor bent end portions 2a, and the resilient contact portions 13 are biased into engagement with the circuits on the printed circuit board 14, respectively. As shown in FIGS.

4b land 6b, compressible resilient seal means 32 are provided between the housing section 8. Moreover, the housing sections may be fastened together by snap fastener means, such as clasp projections 17 (FIG. 7) on the cover section 9 arranged for engagement with corresponding openings 18 contained in the lower section when the sections are in the connected condition.

Figure 8A:
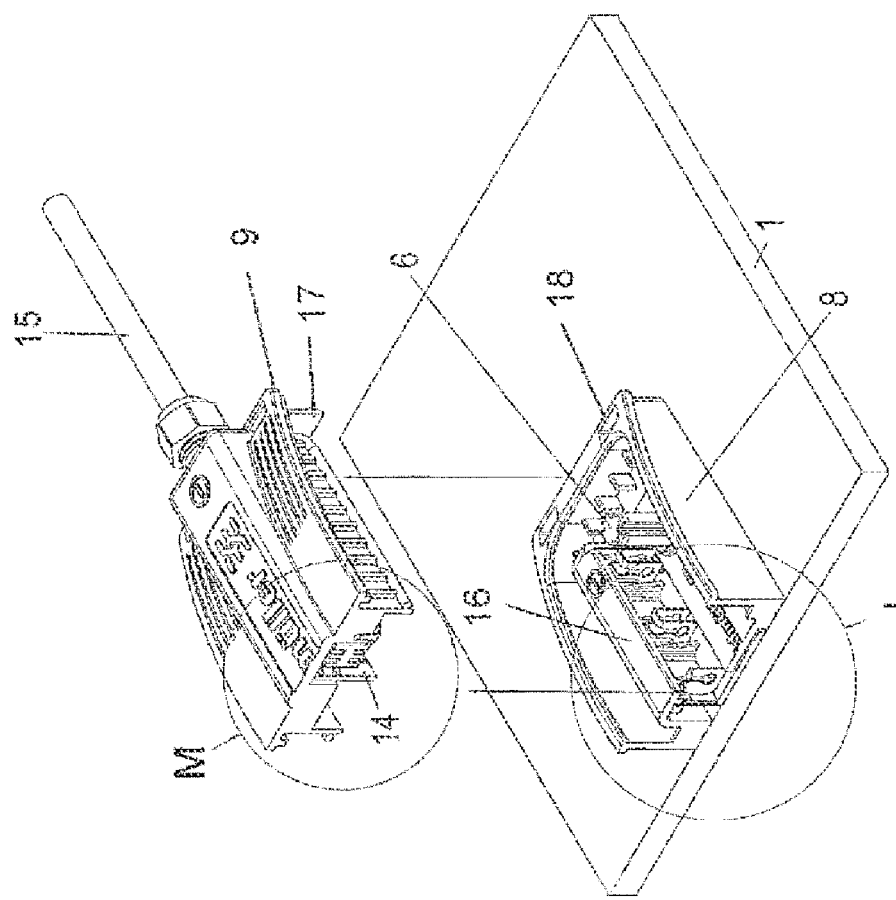
FIG. 8a is a sectional view taken along line 8a -8a of FIG. 7.
Figure 8C:
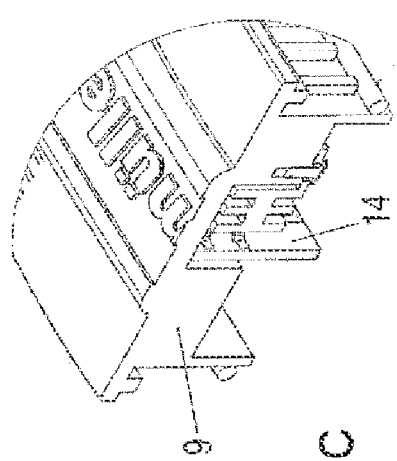
Figure 8B:
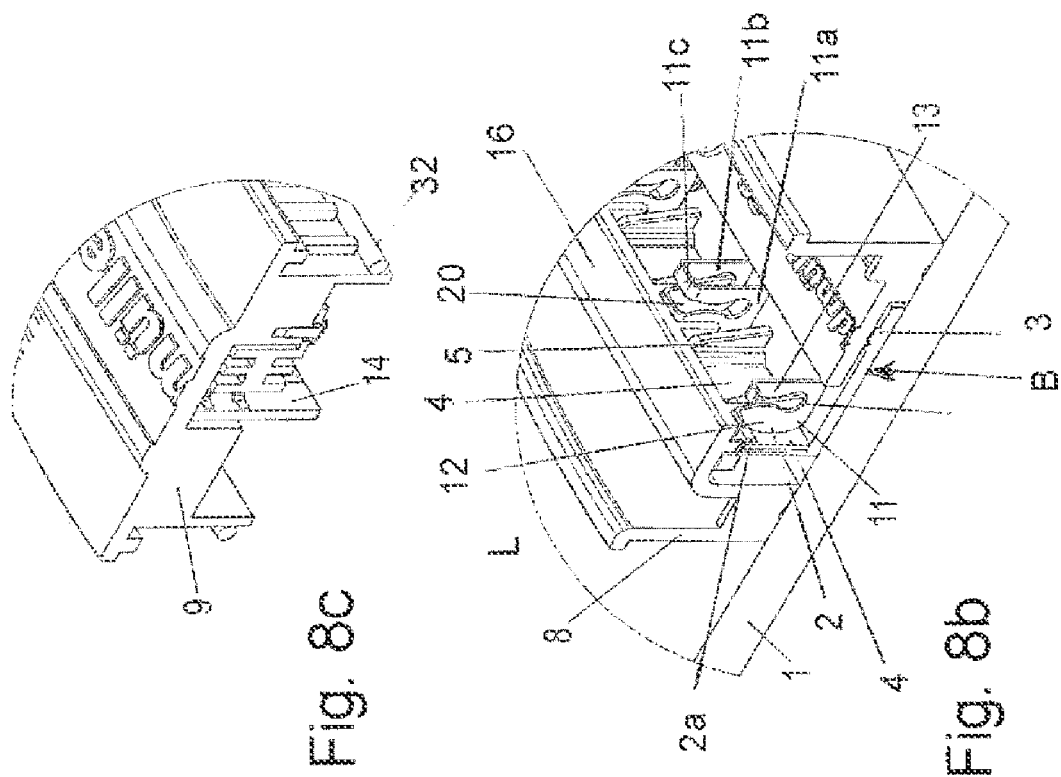

Referring to FIG. 8b, it will be seen that the bifurcated resilient contacts 11 are formed from a bent U-shaped blank having a pair of downwardly extending leg portions 11a, 11b joined at their upper ends by the bridge portions 11c. The downwardly extending slots 20 that define the bifurcated resilient portions 12 ands 13 are adapted to receive the lower end of the printed circuit board that is carried by the housing upper cover section 9, as shown in FIGS. 8a and 8c.

In accordance with a characterizing feature of the invention shown in FIGS. 7 and 8a, if it were to be desired to replace the circuit board 14 of the assembled arrangement of FIGS. 6a and 6b, the cover section 9 is unfastened from the lower body section 8 and is elevated, together with the cables 15 and the printed circuit board 14, toward the illustrated disconnected position. During this disconnection of the components, an integral flange portion 16 of the lower body section extends over the contacts 11 as shown in FIGS. 8a and 8b, thereby to retain the resilient contacts in electrical engagement with the reversely bent end portions 2a of the corresponding flat conductors 2. Either a new assembly—comprising a cover member, cable and printed circuit board—could the be substituted for the original cover assembly, or a new printed circuit board could be substituted for the original component, whereupon the original cover section could be replaced on the lower body section without disturbing the resilient contacts 11, or the housing lower body section.

Figure 9C:
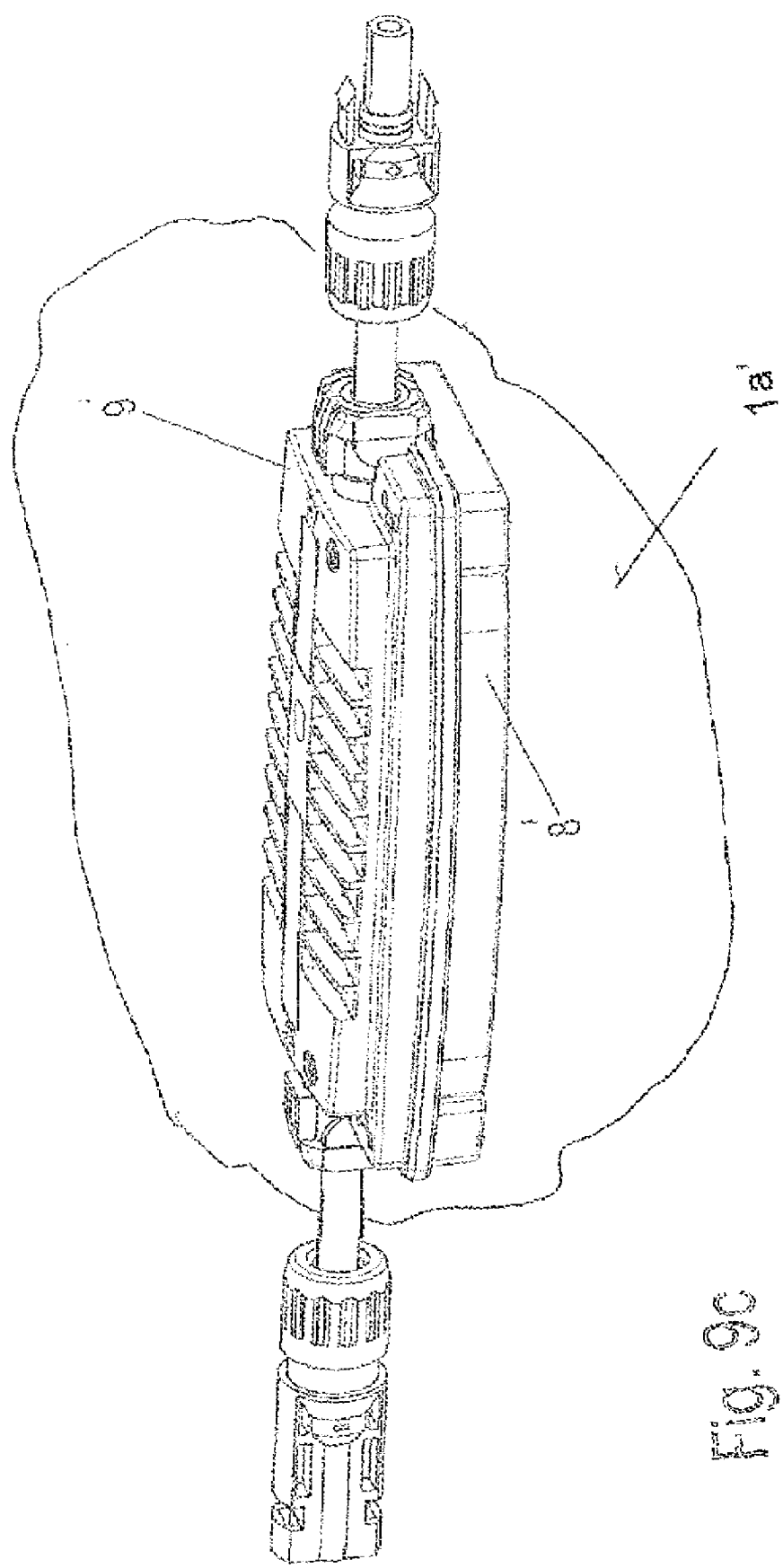
FIG. 9c is a perspective view of the apparatus of FIG. 9b in the assembled connected condition.

Referring now to FIGS. 9a-9e, it will seen that if both the resilient contacts and the printed circuit board are carried by the cover section 9', they can be removed from the flat conductor support member 3' and the housing lower body section 8' simultaneously with the cover section. In FIG. 9a, the flat conductor support member 3' is mounted on the photovoltaic cell 1', and the flat conductor ends 2a' are bent over the horizontal upper edges of the bridge portions 4'. The preassembled connector housing 7'—together with the cables 15', resilient contacts (not shown), and printed circuit board (not shown)—is arranged above the flat conductor support member 3', and is lowered thereon to the seated condition shown in FIG. 9c. In this case, the cable support member 3' is received within the bottom opening contained in the housing lower body section 8'. The reversely bent flat conductor end portions 2a' are engaged by the resilient contacts carried by the cover section 9', and are connected with the insulated conductors of the cables via circuits on the printed circuit board arranged in the connector chamber and carried by the cover section 9'. Preferably, the housing lower body section is adhesively secured to the upper surface of the photovoltaic cell panel.

Figure 9D:
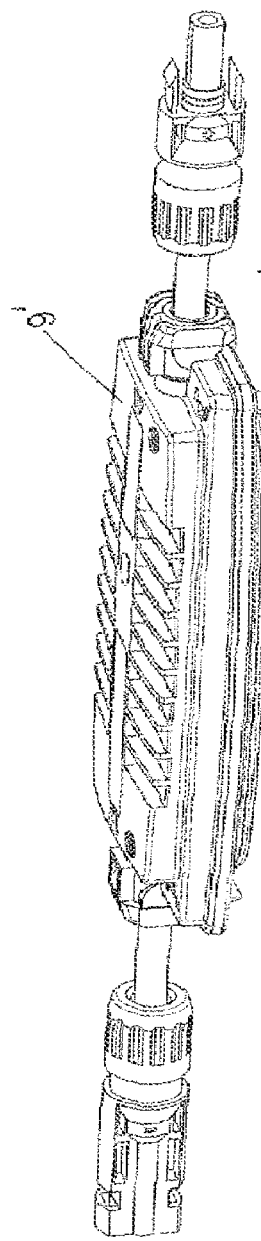
FIG. 9d is a perspective view of the apparatus of FIG. 9c with the connector housing in the disconnected condition.
Figure 9E:
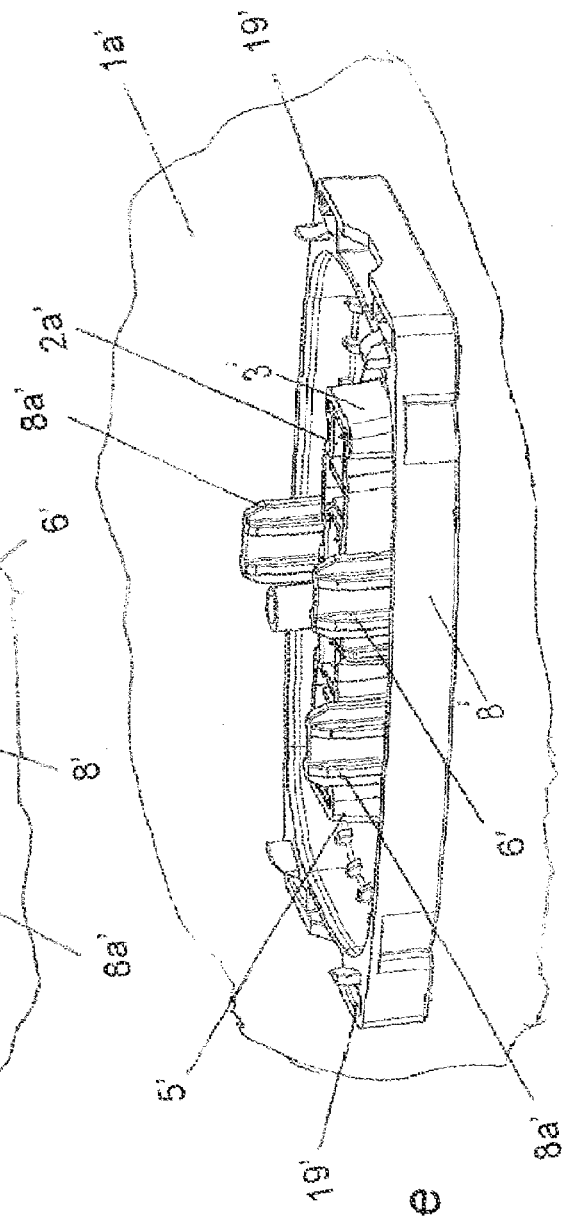
FIG. 9e is an enlarged perspective view of the housing lower body section and the flat conductor section remaining on the photovoltaic panel following the removal of the cover section.

In order to replace the printed circuit board or other electrical component contained in the connector chamber, the catch means 20 and 19 (FIG. 9d) between the housing upper cover and lower body sections are unfastened, and the upper housing section 9' is raised to the disconnected position shown in FIG. 9d. The flat conductor support member 3' and the housing lower section 8' will then remain attached as a unit to the upper surface of the photovoltaic cell panel 1a'. In this case, the resilient contacts are removed the flat conductor support member 3' together with the printed circuit board and the cover section 9'. When a replacement cover section is to be connected to the lower section and flat conductor support assembly (FIG. 9e) that remains connected to the photovoltaic cell, the upper cover section is guided by the guide pedestals 8a' that extend upwardly from the housing body section 8'. If desired, components such as an inverter or diodes may be arranged in the portion of the connector chamber defined with the upper cover section 9'.

While in accordance with the provisions of the Patent Statutes the preferred forms and embodiments of the invention have been illustrated and described, it will be apparent to those skilled in the art that changes may be made without deviating from the invention described above.

What is claimed is:

1. A connector arrangement for connecting the insulated electrical conductors of a cable with the flat conductors of a photovoltaic cell, comprising:
    (a) a photovoltaic cell (1) including a generally horizontal planar panel (1a) having an upper surface, and a plurality of flat conductors (2) extending vertically upwardly from said panel upper surface;
    (b) conductor support means (3) attached to said photovoltaic cell upper surface for supporting the upper free end portions (2a) of said flat conductors at given positions relative to said photovoltaic cell;
    (c) connector means for connecting said flat conductor end portions with the cable conductors, respectively, including:
        (1) a hollow sectional connector housing (7) containing a chamber, said connector housing including:
            (a) a lower body section (8) adapted for displacement between unseated and seated positions relative to said conductor support means, said lower housing section having a lower surface containing a bottom opening (B) receiving said conductor support means when said lower body section is in said seated position; and
            (b) an upper cover section (9) arranged above said lower body section for displacement between disconnected and connected positions relative to said lower section, said cover section containing at least one cable opening (10) for receiving one end of the cable (15);
        (2) a plurality of resilient contacts (11) mounted in said housing chamber adjacent said lower section bottom opening, each of said resilient contacts including:
            (a) a first contact portion (12) arranged for engagement with the corresponding flat conductor end portion (2a) when said housing lower section is in said seated position on said conductor support member, and
            (b) a second contact portion (13) spaced from said first contact portion; and
        (3) a printed circuit board (14) arranged within said connector housing, said printed circuit board including a plurality of electrical circuit means connected with the cable conductors, respectively, said resilient contact second portions being arranged for engagement with respective ones of said printed circuit board electrical circuit means when said housing upper cover section is in said connected position relative to said housing lower body section;
        (4) said housing lower body section (8) and said conductor support member (3) remaining seated on said photovoltaic cell when said housing upper cover section (9) is displaced toward the disconnected position.

2. A connector arrangement for connecting the insulated electrical conductors of a cable with the flat conductors of a photovoltaic cell, comprising:

(a) a photovoltaic cell (1) including a generally horizontal planar panel (1a) having an upper surface, and a plurality of flat conductors (2) extending vertically upwardly from said panel upper surface;
(b) conductor support means (3) attached to said panel upper surface for supporting the upper free end portions (2a) of said flat conductors relative to said photovoltaic cell;
(c) connector means for connecting said flat conductor end portions with the cable conductors, respectively, including:
  (1) a hollow sectional connector housing (7) containing a chamber, said connector housing including:
    (a) a lower body section (8) adapted for displacement between unseated and seated positions relative to said conductor support means, said lower housing section having a lower surface containing a bottom opening (B) receiving said conductor support means when said lower body section is in said seated position; and
    (b) an upper cover section (9) arranged above said lower body section for displacement between disconnected and connected positions relative to said lower section, said cover section containing at least one cable opening (10) for receiving one end of the cable (15);
  (2) a plurality of resilient contacts (11) mounted in said housing chamber adjacent said lower section bottom opening, each of said resilient contacts including:
    (a) a first contact portion (12) arranged for engagement with the corresponding flat conductor end portion (2a) when said housing lower section is in said seated position on said conductor support member, and
    (b) a second contact portion (13) spaced from said first contact portion; and
  (3) a printed circuit board (14) arranged within said connector housing, said printed circuit board including a plurality of electrical circuit means connected with the cable conductors, respectively, said resilient contact second portions being arranged for engagement with respective ones of said printed circuit board electrical circuit means when said housing upper cover section is in said connected position relative to said housing lower body section;
  (4) said housing lower body section (8) and said conductor support member (3) remaining in the seated condition on said photovoltaic cell when said housing upper cover section (9) is displaced toward the disconnected position;
  (5) said printed circuit board (14) being connected with said upper cover section (9) for the simultaneous removal therewith as a unit from said housing lower body section when said upper housing section is displaced toward said disconnected position.

3. A connector arrangement as defined in claim 1, wherein said flat conductor support means comprises a flat conductor support member (3) including:
  (1) a base portion (3a) having a planar bottom surface secured to said panel upper surface adjacent said flat conductors: and
  (2) a plurality of integral bridge portions (4) extending upwardly from said base portion and terminating in flat horizontal upper edges (4a), said flat conductors upper free end portions (2a) being reversely bent downwardly about said bridge portion upper edges for engagement by said resilient contact first portions, respectively.

4. A connector arrangement as defined in claim 3, and further including contact retaining means (16) for retaining said electrical contacts in engagement with said flat conductor bent end portions when said lower housing section is in said seated position and said housing cover section (8) and said printed circuit board (14) are displaced to the disconnected position relative to said housing lower section.

5. A connector arrangement as defined in claim 4, wherein said contact retaining means comprises an integral horizontal retaining flange portion (16) on said housing lower section that extends over said resilient contact first portions (12) when said housing lower section is in said seated position on said photovoltaic cell.

6. A connector arrangement as defined in claim 3, wherein the circuit means for said printed circuit board are mounted on the side of the board remote from said flat conductor end portions; and further wherein each of said resilient contact means comprises a bifurcated generally tulip-shaped contact member (11) containing a downwardly-directed vertical slot (30) that defines said first (12) and second (13) contact portions, said printed circuit board extending into said slot, thereby to bias said first contact portion into engagement with the associated reversely bent back flat conductor end portion, and said second contact portion into engagement with the associated circuit on the adjacent face of said printed circuit board.

7. A connector arrangement as defined in claim 6, wherein each of said contact means comprises a bent U-shaped metal contact member including a pair of downwardly-extending vertical leg portions (11a, 11b) joined at their upper ends by a horizontal bridge portion (11c), said slot (30) extending transversely downwardly through said bridge portion into said leg portions, thereby to define double contact areas (12 and 13) in resilient engagement with said flat conductor bent end portion and with the associated circuit on said printed circuit board, respectively.

8. A connector arrangement as defined in claim 7, wherein said printed circuit board is fixed to said housing upper cover section; and further wherein said resilient contacts are fixed to said housing lower body section.

9. A connector arrangement as defined in claim 1, and further including releasable fastening means (17, 18) for connecting together said upper cover and lower body housing sections when said sections are in the connected position.

10. A connector arrangement as defined in claim 1, wherein said printed circuit board includes electrical components connected with said printed circuit conductor means.

11. A connector arrangement as defined in claim 2, wherein said resilient contacts are connected with said housing cover section for removal from said flat conductor support means simultaneously with said printed circuit board.

12. A connector arrangement as defined in claim 3, wherein said flat conductors are coplanar; and further wherein said bridge edges are coplanar with said flat conductors.

13. A connector arrangement as defined in claim 4, and further including guide means (6) for aligning said flat conductor support member relative to said connector lower body section.

14. A connector arrangement for connecting the insulated electrical conductors of a cable with the flat conductors of a photovoltaic cell, comprising:
  (a) a photovoltaic cell (1) including a horizontal planar panel (1a) having an upper surface, and a plurality of flat conductors (2) extending vertically upwardly from said panel upper surface;
  (b) conductor support means supporting the upper free end portions (2a) of said flat conductors at given positions relative to said photovoltaic cell, said conductor support means comprising a support member (3) having:
- (1) a base portion (3a) secured to said panel upper surface adjacent said flat conductors; and
- (2) a plurality of integral bridge portions (4) extending upwardly from said base portion and terminating at their upper ends in coplanar horizontal upper edges (4a), said flat conductor upper end portions (2a) being reversely bent downwardly about said bridge portion upper edges, respectively;

(c) connector means for connecting said flat conductor end portions with the cable conductors, respectively, said connector means including:
- (1) a hollow sectional connector housing (7) containing a chamber, said connector housing including:
  - (a) a lower body section (8) having a bottom surface containing a bottom opening (B), said lower body section bottom being fastened to said panel upper surface with said conductor support member extending into said bottom opening; and
  - (b) an upper cover section (9) arranged above said lower body section for displacement between disconnected and connected positions relative to said lower body section, said cover section containing at least one cable opening (10) for receiving one end of the cable (15);
- (2) a row of resilient contacts (11) mounted in said housing chamber on said lower body section adjacent said bottom opening, said row of contacts being parallel with the plane containing said bridge portion upper edges, each of said resilient contacts being bifurcated and including:
  - (a) a first contact portion (12) arranged for engagement with the corresponding flat conductor reversely bent end portion (2a); and
  - (b) a second contact portion (13) spaced from said first contact portion; and
- (3) a vertical printed circuit board (14) mounted within said connector housing in a direction parallel with said row of resilient contacts, said printed circuit board extending between said first and second resilient contact portions, thereby to bias said first contact portions into engagement with said flat conductor bend end portions, respectively, said printed circuit board having a first side remote from said first contact portions including a plurality of electrical circuit means connected with the cable conductors, respectively, said second contact portions being biased toward engagement with said electrical circuit means, respectively;
  - (4) said printed circuit board being connected with said housing cover section for the removal therewith relative to said flat conductor support member and said housing lower section when said housing upper cover section is disconnected from said housing lower body section.

15. A connector arrangement as defined in claim 14, and further including guide means (6) for positioning said housing lower body section relative to said flat conductor support member.

16. A connector arrangement as defined in claim 15, and further including retaining means (16) on said housing lower body section for retaining said resilient contact first portions in engagement with said reversely bent flat conductor end portions when said upper cover section is displaced to the disconnected position relative to said lower body section.

17. Apparatus as defined in claim 16, and further including fastening means (17, 18) for fastening said housing sections together when said sections are in the connected position.

18. Apparatus as defined in claim 17, and further including resilient compressible seal means (32) arranged between said housing sections for sealing said chamber when said housing upper cover section is connected with said housing lower body section.

19. Apparatus as defined in claim 14, wherein said flat conductor support member includes separating wall portions (5) arranged between said bridge portion flat upper edges.

* * * * *